United States Patent [19]

Lentz

[11] 4,409,554
[45] Oct. 11, 1983

[54] ELECTRONIC SIGNAL SIMULATION DEVICE

[76] Inventor: Joe B. Lentz, 317 Silver Fox La., Goose Creek, S.C. 29445

[21] Appl. No.: 237,834

[22] Filed: Feb. 25, 1981

[51] Int. Cl.³ .................... H03K 3/017; H03K 7/06
[52] U.S. Cl. ........................ 328/14; 307/271; 328/18; 328/62; 328/58; 328/188
[58] Field of Search ............ 328/14, 17, 18, 19, 328/29, 30, 58, 62, 63, 72, 74, 187, 188; 307/268, 269, 271

[56] References Cited

U.S. PATENT DOCUMENTS

| | | | |
|---|---|---|---|
| 3,172,042 | 3/1965 | Dawirs | 328/30 |
| 3,355,539 | 11/1967 | Munch, Jr. et al. | 328/18 |
| 3,464,018 | 8/1969 | Cliff | 328/14 |
| 3,999,049 | 12/1976 | Roche et al. | 328/14 |
| 4,056,692 | 11/1977 | Place | 328/14 |

Primary Examiner—John Zazworsky
Attorney, Agent, or Firm—R. F. Beers; F. I. Gray

[57] ABSTRACT

A portable, multi-signal electronic simulator device which provides the six basic parameters required for signal recognition training. A crystal controlled oscillator provides a precise timing signal, and is divided to provide a plurality of discrete frequencies. A modulation generator produces multiple, discrete signals depending upon the selected frequency from the oscillator and upon a preset selection of the parameters for each discrete signal.

13 Claims, 6 Drawing Figures

ELECTRONIC SIGNAL SIMULATION DEVICE

The invention described herein may be manufactured and used by and for the Government of the United States of America for Governmental purposes without the payment of any royalties thereon or therefor.

BACKGROUND OF THE INVENTION

1. Field of the Invention

The present invention relates to electronic signal simulation devices, and more particularly to a portable, multi-signal electronic simulator for electronic warfare (EW) training and testing.

2. Description of the Prior Art

Currently there are no devices available for EW traning and testing aboard ships at sea or aircraft in flight. Existing devices are large, heavy and use inflexible preprogrammed signals from video tapes, and are only suitable for use ashore.

SUMMARY OF THE INVENTION

Accordingly, the present invention provides a portable, multi-signal electronic simulator device which provides the six basic parameters required for signal recognition training. A crystal controlled oscillator provides a precise timing signal, and is divided to provide a plurality of discrete frequencies. A modulation generator produces multiple, discrete signals depending upon the selected frequency from the oscillator and upon a preset selection of the parameters for each discrete signal.

Therefore, it is an object of the present invention to provide a compact, flexible multi-signal generator for simulating electronic signals.

Another object of the present invention is to provide a portable, inexpensive electronic signal simulator for use aboard ships at sea and aircraft in flight.

Other objects, advantages and novel features of the present invention will be apparent from the following detailed description when read in conjunction with the appended claims and attached drawing.

DESCRIPTION OF THE PREFERRED EMBODIMENT

Figure 1:
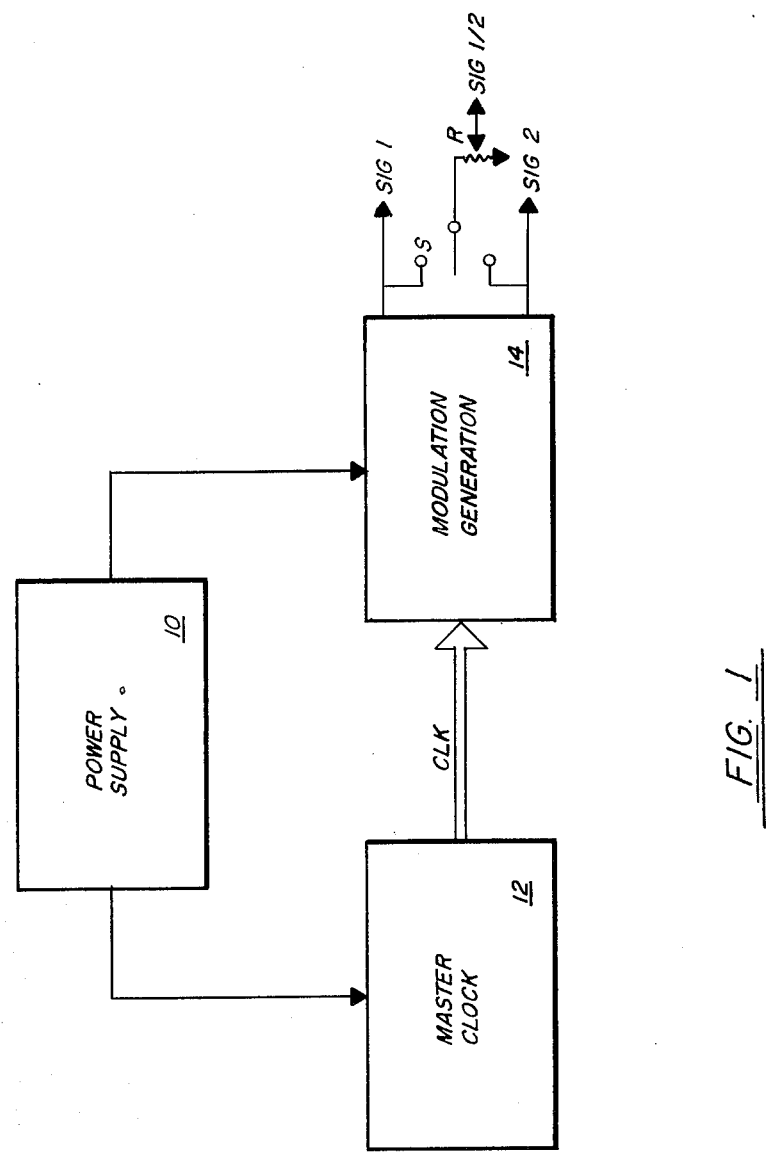
FIG. 1 is a block diagram of a multi-signal electronic simulator according to the present invention.

Referring now to FIG. 1 a multi-signal electronic simulator is shown. A power supply 10 converts available ac voltage to an unregulated dc voltage using a standard full wave rectifier circuit. A master clock 12 is a free running oscillator when it receives power from the power supply 10. The unregulated dc voltage from the power supply 10 is converted to regulated dc voltage at the master clock 12 input, and the master clock provides a plurality of discrete frequencies as the output. A modulation generator 14 receives the discrete frequencies from the master clock 12 and power from the power supply 10, which power is converted to regulated dc voltage, to produce, in this embodiment, two different output signals, SIG 1 and SIG 2, and a third output signal, SIG 1/2, selected by a signal select switch S from SIG 1 or SIG 2, which signal gain can be varied by a variable resistor R.

Figures 2, 3:
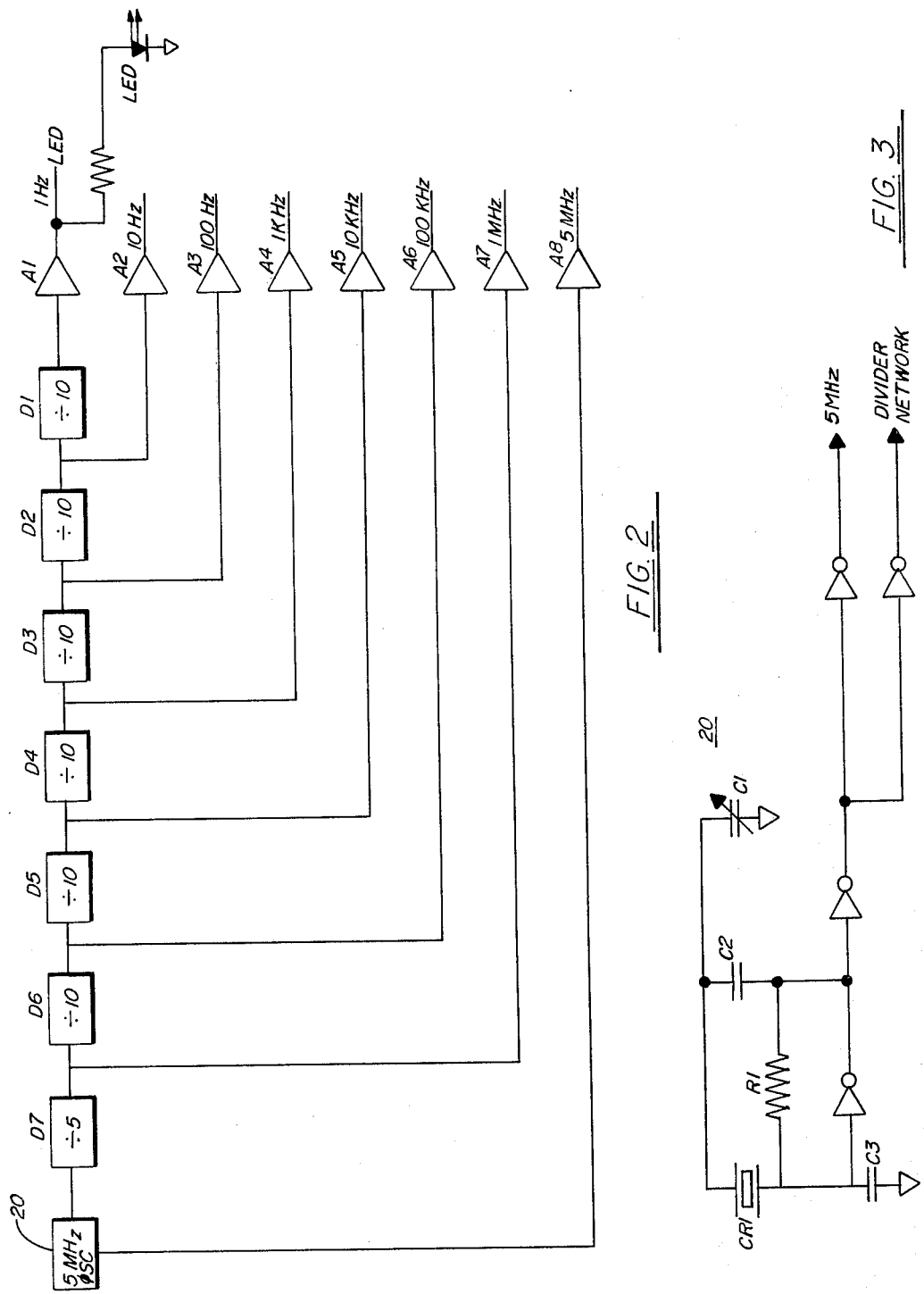
FIG. 2 is a block diagram of a master clock circuit for the multi-signal electronic simulator.
FIG. 3 is a schematic diagram of a crystal controlled oscillator for the master clock circuit.

FIGS. 2 and 3 provide details of the master clock 12. A crystal controlled oscillator 20 provides a precise master frequency such as 5 MHz. A variable capacitor C1 provides fine tuning of the crystal CR1 output frequency. The output of the oscillator 20 is buffered and input into a divider network, D1-D7. The divider network discretely divides the master frequency into a plurality of discrete frequencies from 1 Hz in multiples of 10 to 1 MHz which together with the master frequency are output to the modulation generator 14.

Figure 4:
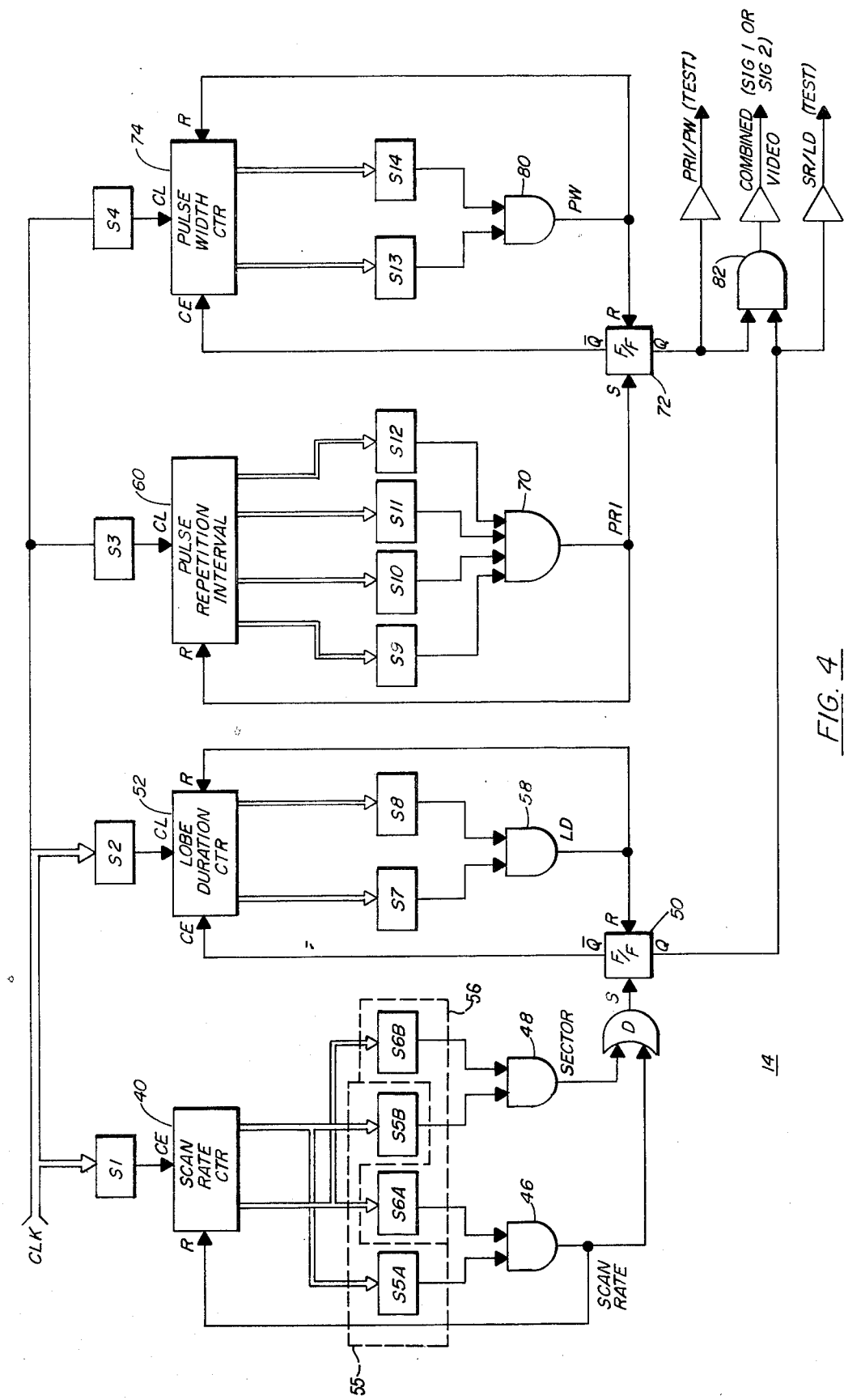
FIG. 4 is a block diagram of one channel of a modulation generator for the multi-signal electronic simulator.
Figure 5:
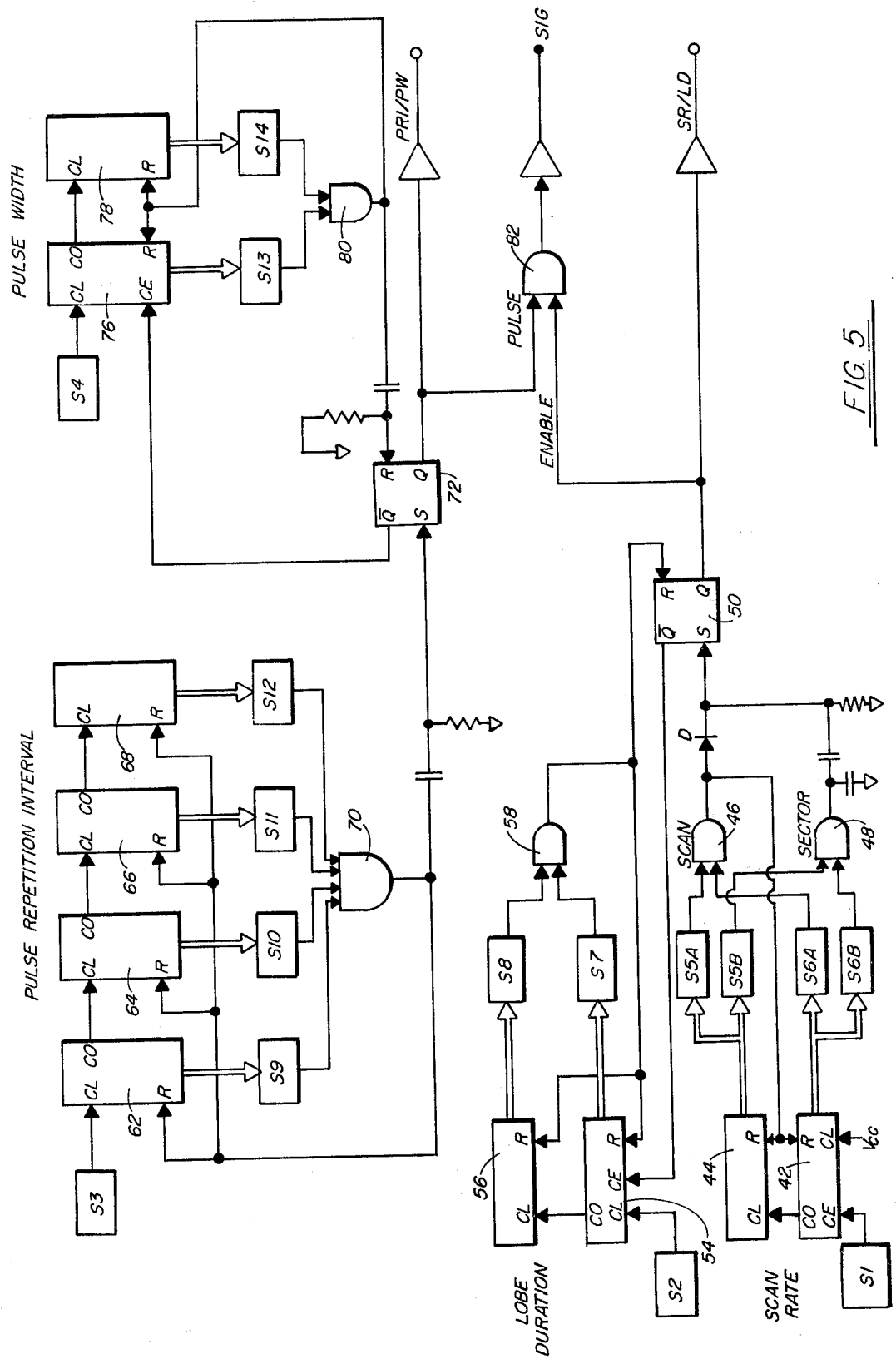
FIG. 5 is a schematic diagram of one channel of the modulation generator.

The output of the master clock 12, CLK, is input to a plurality of clock switches, S1-S4, for one channel of the modulation generator 14 as shown in FIGS. 4 and 5. All the discrete frequencies are input to switches S1 and S2, but only the two highest frequencies are input to S3 and S4. The frequency selected by S1 is input to a scan rate counter 40 which is two 10-step continuous counters connected serially. Each frequency pulse from S1 steps the first scan rate counter 42, and each cycle of the first scan rate counter steps the second scan rate counter 44. Switches S5 and S6 are wired so that the selected output of each scan rate counter 42, 44 is input to each stage of their respective switches S5A,S5B and S6A,S6B. A scan AND gate 46 and a sector AND gate 48 combine the count of the two scan rate counters 42, 44 selected by switches S5,S6. The outputs of the AND gates 46, 48 set a first bistable flip-flop 50 via OR gate D.

A lobe duration counter 52, having two LD 10-step counters 54 and 56 connected in series, is cycled by the frequency selected by switch S2. Switches S7 and S8 select the duration desired and the switch outputs are combined by an LD AND gate 58. When the first flip-flop 50 is set by the outputs of the scan AND gate 46 or sector AND gate 48, the lobe duration counter 52 is enabled by the Q output and counts the selected clock frequency from S2. When the selected count is achieved, the LD AND gate 58 resets the first flip-flop 50.

Switch S3 selects between the two highest frequency clock rates to clock a pulse repetition interval (PRI) counter 60 having four 10-step counters 62, 64, 66, 68 in series. Switches S9-S12 select the desired PRI which are combined by a PRI AND gate 70. The output of the PRI AND gate 70 sets a second bistable flip-flop 72. The second bistable flip-flop 72 enables a pulse width counter 74 having two 10-step counters 76, 78 in series. Switches S13 and S14 select the pulse width desired and a PW AND gate 80 combines their outputs to reset the second bistable flip-flop 72. An output AND gate 82 combines the outputs of the two flip-flops 50, 72 and produces a signal output SIG when both flip-flops are set simultaneously.

Figure 6:
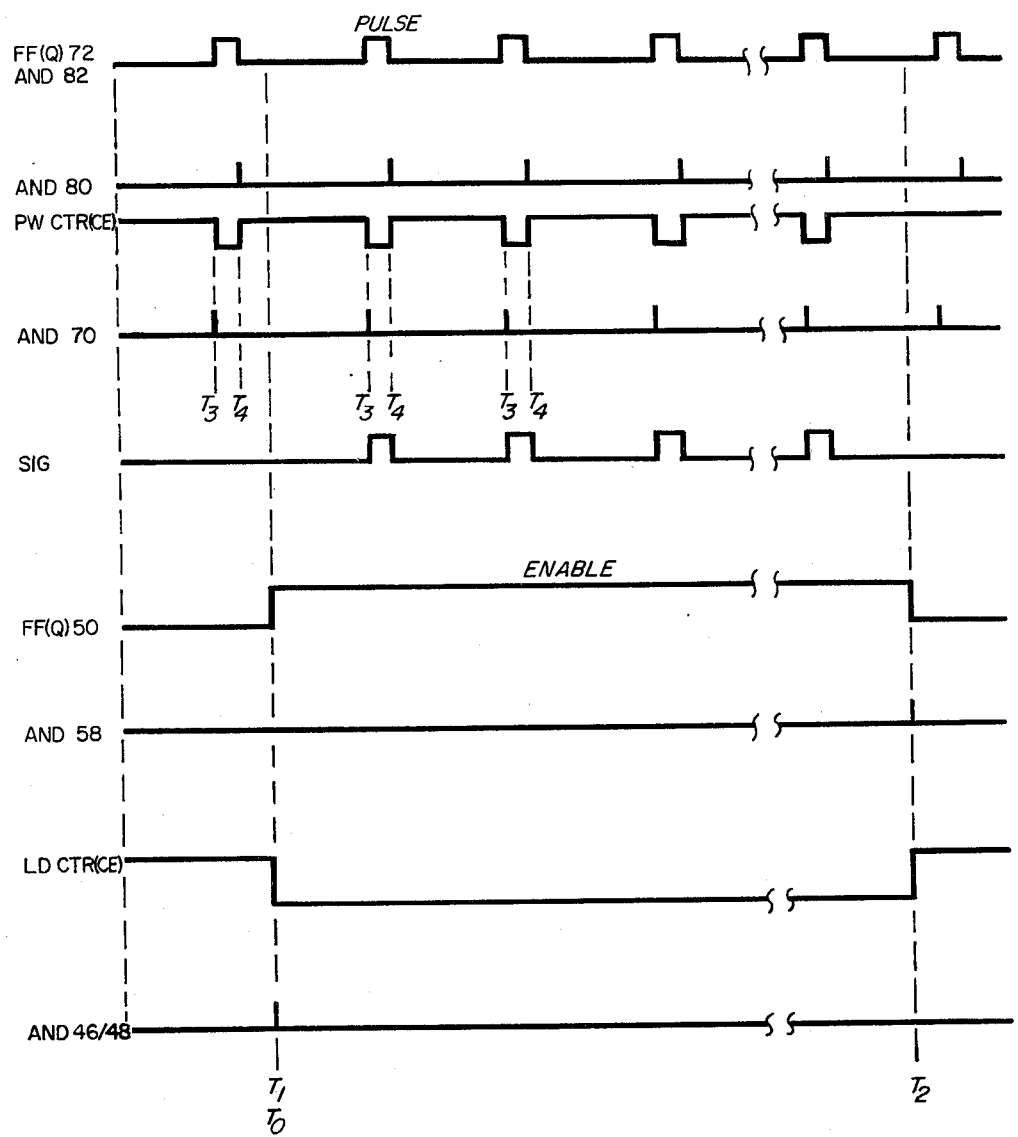
FIG. 6 is a timing diagram for one type of operation of the multi-signal electronic simulator.

As shown in FIG. 6 the scan rate counter 40 via AND gates 46 or 48 sets the first flip-flop 50 at some time $t_1$ after $t_0$ power on or reset of the scan rate counters 42, 44 and resets the scan rate counter to $t_0$. The LD counter 52 starts counting at time $t_1$ until time $t_2$, when the flip-flop 50 is reset and the ENABLE to AND gate 82 is removed. The PRI counter 60 sets the second flip-flop 72 at intervals of $t_3$ and enables the PW counter 74. At time $t_4$ after $t_3$ the second flip-flop 72 is reset by AND gate 80. The interval $t_3$-$t_4$ provides PULSES to AND gate 82. Thus, SIG is the PULSES which occur during ENABLE. ENABLE simulates the periodic scanning of a receiver by an emitter having the given scan rate and beam width, while PULSES simulates the pulse characteristic of the emitter.

In operation the parameter values of the emitter to be simulated are first determined, translating PRF into PRI and scan rate frequency into milliseconds. The power supply 10 is turned on and the crystal oscillator CR1 is given time to stabilize. The Scan Rate, Lobe Duration, PRI and Pulse Width clock switches, S1-S4 respectively, are set to the appropriate discrete frequencies. If the signal to be simulated is not a bidirectional sector scan, the sector switches S5B,S6B are set to count 10 on each switch. The Scan Rate S5A,S6A, Lobe Duration S7,S8, PRI S9-S12 and Pulse Width S13,S14 parameter switches are set to the parameter values of the signal to be simulated. If the signal to be simulated is bidirectional sector, the Sector switches S5B,S6B are set to some value less than the scan rate, but not exactly one-half as this produces an apparent circular signal. If the scan type of the signal is steady, the scan rate S5A,S6A are set to zero and lobe duration S7,S8 are set to a value between 1 and 9 on each switch.

If the signal is a pulse group, the pulse group PRI is set into the PRI switches S9-S12, the spacing between pulses within the pulse group is set into the scan rate switches S5A,S6A and the scan rate clock switch S1 is set to the appropriate high frequency range. The pulse width of the pulses within the pulse group is set into the LD switches S7,S8 and the LD clock switch S2 is likewise set to the appropriate high frequency range. The number of pulses in the pulse group multiplied by the value set into the SR switches S5A,S6A plus one pulse width is set into the PW switches S13,S14. If it is desired to stagger the interval of the pulses within the pulse group, the sector switches S5B,S6B are set to a value greater than LD but less than SR and are adjusted to achieve the desired interval.

If the output is to be coupled directly into a receiver video input jack (single signal operation), the SIG 1/2 output is selected and the signal select switch S is set to the appropriate position and the output level is adjusted by R. If the output is to modulate an RF generator, either the SIG 1/2 output is connected to one external input or SIG 1 and SIG 2 are connected each to an external input of an RF generator for dual signal operation. The RF generator is connected to the appropriate receiver tuner input, or for dual signal operation the outputs of two RF generators are tee connected to the receiver tuner input. For transmitting a signal the RF generator(s) is connected to the input of a power amplifier, which has an antenna connected to its output.

Thus, the present invention is a portable, light weight electronic signal simulator having at least two signal channels which can provide continuous operation with flexibility to provide a real time, on-board training and testing of EW equipment and personnel, or when transmitted can provide training and testing signals to groups of ships and or aircraft.

What is claimed is:

1. An electronic signal simulator device comprising:
   a master clock having a stable oscillator and outputting a plurality of discrete frequencies derived from said stable oscillator;
   a modulation generator having at least one signal output channel, said modulation generator having as an input said discrete frequencies which are used to generate an output signal with a predetermined signal characteristic;
   said signal output channel having a plurality of clock switches, each of said clock switches selecting one of said discrete frequencies, a plurality of counters, each of said counters being connected to one of said clock switches to count the frequency pulses of said discrete frequency selected, and a plurality of parameter switches connected to the outputs of said counters to select said predetermined signal characteristic for said output signal; and
   means for supplying electrical power to said master clock and said modulation generator.

2. An electronic signal simulator device as recited in claim 1 wherein said clock switches comprise:
   a first clock switch to select one of said discrete frequencies;
   a second clock switch to select one of said discrete frequencies;
   a third clock switch to select one of said discrete frequencies; and
   a fourth clock switch to select one of said discrete frequencies.

3. An electronic signal simulator device as recited in claim 2 wherein said counters comprise:
   a scan rate counter to count frequency pulses from said first clock switch;
   a lobe duration counter to count frequency pulses from said second clock switch;
   a pulse repetition interval counter to count frequency pulses from said third clock switch; and
   a pulse width counter to count frequency pulses from said fourth clock switch.

4. An electronic signal simulator device as recited in claim 3 wherein said parameter switches comprise:
   a scan switch to select a scan count from said scan rate counter, said scan count resetting said scan rate counter;
   a sector switch to select a sector count from said scan rate counter;
   a lobe duration switch to select a lobe duration count from said lobe duration counter, said lobe duration count resetting said lobe duration counter;
   a pulse repetition interval switch to select a pulse repetition interval count from said pulse repetition interval counter, said pulse repetition interval count resetting said pulse repetition interval counter; and
   a pulse width switch to select a pulse width count from said pulse width counter, said pulse width count resetting said pulse width counter.

5. An electronic signal simulator device as recited in claim 4 wherein said signal output channel further comprises:
   means for providing an output pulse when said scan count or said sector count occurs;
   means for enabling said lobe duration counter to count, said lobe duration counter enabling means being set by said output pulse;
   means for enabling said pulse width counter to count, said pulse width counter enabling means being set by said pulse repetition interval count; and
   means for combining said lobe duration counter enabling means and said pulse width counter enabling means to produce said output signal.

6. An electronic signal simulator device as recited in claim 5 wherein said master clock comprises:
   a crystal controlled stable oscillator; and
   a plurality of frequency dividers to divide the frequency output of said crystal controlled stable oscillator into said discrete frequencies.

7. An electronic signal simulator device comprising:
   means for supplying electrical power to said electronic signal simulator device;
   a master clock having a stable oscillator and outputting a plurality of discrete frequencies derived from said stable oscillator;
   a first clock switch to select one of said discrete frequencies;
   a second clock switch to select one of said discrete frequencies;
   a third clock switch to select one of said discrete frequencies;
   a fourth clock switch to select one of said discrete frequencies;
   a scan rate counter to count frequency pulses from said second clock switch;
   a pulse repetition interval counter to count frequency pulses from said third clock switch;
   a pulse width counter to count frequency pulses from said fourth clock switch;
   a first flip-flop to enable said lobe duration counter to count when said first flip-flop is set;
   a second flip-flop to enable said pulse width counter to count when said second flip-flop is set;
   means for selecting a scan count from said scan rate counter, said scan count being used to reset said scan rate counter and to set said first flip-flop;
   means for selecting a sector count from said scan rate counter to set said first flip-flop;
   means for selecting a lobe duration count from said lobe duration counter, said lobe duration count being used to reset said lobe duration counter and said first flip-flop;
   means for selecting a pulse repetition interval count from said pulse repetition interval counter, said pulse repetition interval count being used to reset said pulse repetition interval counter and to set said second flip-flop;
   means for selecting a pulse width count from said pulse width counter, said pulse width count being used to reset said pulse width counter and said second flip-flop; and
   means for combining the outputs of said first and second flip-flops such that said signal output occurs when both said first and second flip-flops are set.

8. An electronic signal simulator device comprising:
   means for supplying electric power to said electronic signal simulator device;
   a master clock having a crystal controlled stable oscillator and a plurality of frequency dividers to divide the frequency output of said crystal controlled stable oscillator into a plurality of discrete frequencies; and
   a modulation generator having at least one signal output channel, said modulation generator having as an input said discrete frequencies which are used to generate an output signal with a predetermined signal characteristic; and
   said signal output channel having a plurality of clock switches, each of said clock switches selecting one of said discrete frequencies, a plurality of counters, each of said counters being connected to one of said clock switches to count the frequency pulses of said frequency selected, and a plurality of parameter switches connected to the outputs of said counters to vary said predetermined signal characteristic for said output signal.

9. An electronic signal simulator device as recited in claim 8 wherein said clock switches comprise:
   a first clock switch to select one of said discrete frequencies;
   a second clock switch to select one of said discrete frequencies;
   a third clock switch to select one of said discrete frequencies; and
   a fourth clock switch to select one of said discrete frequencies.

10. An electronic signal simulator device as recited in claim 9 wherein said counters comprise:
    a scan rate counter to count frequency pulses from said first clock switch;
    a lobe duration counter to count frequency pulses from said second clock switch;
    a pulse repetition interval counter to count frequency pulses from said third clock switch; and
    a pulse width counter to count frequency pulses from said fourth clock switch.

11. An electronic signal simulator device as recited in claim 10 wherein said parameter switches comprise:
    a scan switch to select a scan count from said scan rate counter, said scan count resetting said scan rate counter;
    a sector switch to select a sector count from said scan rate counter;
    a lobe duration switch to select a lobe duration count from said lobe duration counter, said lobe duration count resetting said lobe duration counter;
    a pulse repetition interval switch to select a pulse repetition interval count from said pulse repetition interval counter, said pulse repetition interval count resetting said pulse repetition interval counter; and
    a pulse width switch to select a pulse width count from said pulse width counter, said pulse width count resetting said pulse width counter.

12. An electronic signal simulator device as recited in claim 11 wherein said signal output channel further comprises:
    means for providing an output pulse when said scan count or said sector count occurs;
    means for enabling said lobe duration counter to count, said lobe duration counter enabling means being set by said output pulse;
    means for enabling said pulse width counter to count, said pulse width counter enabling means being set by said pulse repetition interval count; and
    means for combining said lobe duration counter enabling means and said pulse width counter enabling means to produce said output signal.

13. An electronic signal simulator device as recited in claim 6 or 12 further comprising:
    a second of said at least one signal output channel in said modulation generator having a second output signal and having said discrete signals as an input; and
    means for selecting between said output signals from said signal output channels.

* * * * *